United States Patent [19]
Ichinose et al.

[11] Patent Number: 6,051,778
[45] Date of Patent: Apr. 18, 2000

[54] ELECTRODE STRUCTURE, PROCESS PRODUCTION THEREOF AND PHOTO-ELECTRICITY GENERATING DEVICE INCLUDING THE ELECTRODE

[75] Inventors: Hirofumi Ichinose, Tokyo; Akio Hasebe, Nagahama; Tsutomu Murakami, Nara; Satoshi Shinkura, Nagahama; Yukie Ueno, Nara, all of Japan

[73] Assignee: Canon Kabushiki Kaisha, Tokyo, Japan

[21] Appl. No.: 08/988,967

[22] Filed: Dec. 11, 1997

[30] Foreign Application Priority Data

Dec. 13, 1996 [JP] Japan .................... 8-333475

[51] Int. Cl.⁷ .................... H01L 31/0224; H01L 31/18; H01L 31/075
[52] U.S. Cl. .................... 136/256; 136/243; 136/244; 438/83; 438/98; 438/119; 257/459; 257/753; 429/212; 429/218; 429/111; 429/232; 429/217; 427/58; 427/74
[58] Field of Search .................... 136/243, 244, 136/256; 438/83, 98, 119; 257/459, 753; 429/212, 218, 111, 232, 217; 427/58, 74

[56] References Cited

U.S. PATENT DOCUMENTS

| | | | |
|---|---|---|---|
| 4,260,429 | 4/1981 | Moyer | 136/256 |
| 4,283,591 | 8/1981 | Boer | 136/256 |
| 5,084,107 | 1/1992 | Deguchi et al. | 136/256 |
| 5,428,249 | 6/1995 | Swayama et al. | 257/746 |
| 5,457,057 | 10/1995 | Nath et al. | 438/67 |

FOREIGN PATENT DOCUMENTS

| | | |
|---|---|---|
| 0 710 990 | 5/1996 | European Pat. Off. . |
| 710990 | 5/1996 | European Pat. Off. . |
| 0 751 575 | 1/1997 | European Pat. Off. . |
| 59-167056 | 9/1984 | Japan . |
| 64-6534 B2 | 2/1989 | Japan . |
| 3-6867 | 1/1991 | Japan . |

*Primary Examiner*—Alan Diamond
*Attorney, Agent, or Firm*—Fitzpatrick, Cella, Harper & Scinto

[57] ABSTRACT

An electrode structure is formed by superposing a bar-shaped or linear metal member on an electroconductive layer comprising a polymeric resin and an electroconductive filler dispersed therein. The electroconductive layer may be formed as an electroconductive sheet in advance and patterned before it is superposed with the metal member, followed by heat and pressure application to provide an electrode structure showing a low resistivity, a large adhesion even to an elevation and a high reliability. The electrode structure is suitably used for providing a collector electrode structure on a photo-electricity generating device.

20 Claims, 7 Drawing Sheets

ELECTRODE STRUCTURE, PROCESS PRODUCTION THEREOF AND PHOTO-ELECTRICITY GENERATING DEVICE INCLUDING THE ELECTRODE

FIELD OF THE INVENTION AND RELATED ART

The present invention relates to an electrode (structure) exhibiting excellent performances and a high reliability, a process for producing or forming such an electrode, and a photo-electricity generating device using the electrode. More specifically, the present invention relates to an electrode structure having excellent electroconductivity, adhesion and durability comprising an electroconductor layer and a linear metal member, and an electrode structure including a further laminated busbar.

The present invention further relates to a structure of a photo-electricity generating device, particularly a solar cell, having excellent electricity collecting performance, high initial performances and high reliability in long period of use, due to inclusion of the electrode structure.

A solar cell as an application of a photo-electricity generating device is widely used as a power supply for public appliances, such as electronic calculators and wrist watches, and has also called an attention as a source of electricity substituting for the electricity obtained from fossil fuels, such as petroleum and coal.

A solar cell is a product based on technology utilizing a diffusion potential occurring at a semiconductor junction, such as a pn junction, a pin junction or a Schottky junction of semiconductors. In such a solar cell, a semiconductor such as silicon absorbs sunlight to generate photocarriers including electrons and holes, and the photocarriers are caused to drift under the action of an internal electric field generated by the diffusion potential of the junction to be taken out as electricity. Among such solar cells using semiconductors, a thin-film solar cell using a tetrahedral amorphous semiconductor, such as amorphous silicon carbide, is regarded as promising because of its advantages such that it can be formed in a larger area and in a thinner film and can be deposited on an arbitrary substrate material, compared with a single crystal solar cell.

An amorphous silicon solar cell may for example have a structure comprising a laminate of a p-layer, an i-layer are an n-layer each of an amorphous silicon thin film, on a substrate. Further, it has also considered to adopt a so-called tandem cell or triple cell including two or more of the above-mentioned pin junction in order to improve the conversion efficiency.

On the light incidence side and the rear side of the semiconductor, a pair of electrodes comprising an upper electrode and a lower electrode are disposed. In an amorphous silicon solar cell, the semiconductor per se has a high sheet resistivity, so that a transparent upper electrode extending over the entire semiconductor generally comprising a transparent conductor film of $SnO_2$ or ITO is required. The transparent conductor film can also function as a reflection-preventing film. On the transparent conductor film, collecting grid electrodes are disposed in a comb-shape so as not to hinder the light incidence, and a busbar is further disposed so as to collect currents from the grid electrodes.

Metal layers, etc., formed, e.g., by vacuum evaporation or sputtering, have been used as such grid electrodes, but have posed difficulties, such that an expensive equipment cost is required.

In recent years, a research has been made on production of electrodes suitable for mass production and at low cost by using electroconductor paste or paint. A conventional electroconductive paste contains silver or copper as an electroconductive material but involves difficulties such that it does not generally provide a good contact resistance but results in an ionic substance due to interaction with moisture. Accordingly, when a defect such as a pinhole is present during the use of a solar cell as described above, the electrical resistance of the defect portion is liable to lower, thus resulting in a deterioration in performances, such as a conversion efficiency, with lapse of service time.

As a measure for coping with such a problem, it has been known for example to use a laminate electrode structure including a first layer of an electroconductive paste containing both carbon and a metal, and a second layer of a paste containing only a metal (Japanese Patent Publication (JP-B) 64-6534). It has been also known to use a structure comprising a linear metal member fixed on a photo-electricity generating device with an electroconductive adhesive (Japanese Laid-Open Patent Application (JP-A) 3-6867).

(1) In the conventional case of forming an electrode by printing of an electroconductive paint or paste as described above, such an electroconductive paint or paste is first prepared by dispersing an electroconductive filler in a polymeric resin and then printed or applied to form an electrode. In this case, however, in order to provide an appropriate printability, etc., it is necessary to select an appropriate solvent and strictly control the composition of the electroconductive filler and the polymeric resin and the viscosity.

(2) In the case of the electrode formation by the printing or application of the electroconductive paste, the resultant electrode thickness is restricted to 20–30 $\mu$m or below. Accordingly, in order to reduce the electricity loss, it becomes necessary to increase the electrode width or the number of electrodes. Further, in the case of providing a laminate or superposed structure including two or more layers as disclosed by JP-B 64-6534, it is difficult to adjust an alignment of the superposed electroconductive layers by printing or application because of the paste or liquid state.

(3) According to the structure of JP-B 64-6534, it may be possible to solve the problem of a lower yield due to shunt but it is difficult to suppress the migration of ionic substance due to interaction with moisture, thus being liable to fail in preventing the leakage due to moisture in actual use. Further, it is impossible to improve the electricity loss by a multi-layer structure of only electroconductive pastes.

(4) FIG. 12 is a schematic sectional view of an electrode side of a conventional photo-electricity generating device including a base structure 300 of the photo-electricity generating device, a stepwise elevation 301, a metal member 307, an electroconductive paste layer 308, a busbar 309, and an insulating layer 310. When such an electroconductive layer 308 is formed by using the method of JP-A 3-6867, the stepwise elevation 301 may not be filled with the paste or may be provided with cracks in some cases, so that the metal member 307 formed thereon cannot exhibit a sufficient adhesion at the stepwise elevation.

Even if an electroconductive adhesive is applied in advance onto the substrate to provide an improved fixation, a peeling can occur from a non-adhered portion in case where the adhesive is not sufficiently attached or where the metal member 307 is not flat. The peeling can be promoted due to moisture, etc., because of the insufficient adhesion. Further, not only because of such an insufficient adhesion of the electroconductive adhesive at the stepwise elevation 307, the metal member 307 can be broken due to, e.g., friction at the edge of the stepwise elevation 301.

(5) When such an electrode accompanied with difficulties as described above is used in an photo-electricity generating device used outdoors, not only the leakage due to moisture but also a lowering in conversion efficiency due to an increased series resistance can occur, thus leaving problems regarding the reliability.

SUMMARY OF THE INVENTION

In view of the above-mentioned problems, an object of the present invention is to provide an electrode structure comprising an electroconductive sheet, which is applicable to an photo-electricity generating device or other devices and can exhibit a low resistance, a high adhesion and a high reliability.

Another object of the present invention is to provide a solar cell having solved the problems of shunt and insufficient reliability of the photo-electricity generating device or element, thus exhibiting good performances.

According to the present invention, there is provided an electrode structure, comprising an electroconductive layer comprising a polymeric resin and an electroconductive filler dispersed therein, and a bar-shaped or linear metal member superposed on and perferably at least partially embedded in the electroconductive layer.

According to the present invention, there is further provided an electrode structure, comprising: a bar-shaped or linear metal member, a busbar, and an electroconductive layer disposed between the metal member and the busbar and comprising a polymeric resin and an electroconductive filler dispersed in the polymeric resin, so that the metal member is preferably embedded in the electroconductive layer.

According to another aspect of the present invention, there is also provided a process for producing an electrode structure, comprising:

forming an electroconductive sheet comprising a polymeric resin and an electroconductive filler dispersed therein, optionally cutting the electroconductive sheet into desierd pattern, superposing the electroconductive sheet on a substrate, superposing a bar-shaped or linear metal member on the electroconductive sheet to form a superposed structure, and applying heat and pressure onto the superposed structure to form an electrode structure wherein the metal member is physically and electrically connected to the substrate via the electroconductive sheet.

According to the present invention, there is further provided a process for producing an electrode structure, comprising:

forming an insulating layer locally on a substrate, superposing a bar-shaped or linear metal member on the substrate, superposing an electroconductive layer comprising a polymeric resin and an electroconductive filler dispersed therein on the metal member, superposing a busbar on the electroconductive layer to form a superposed structure, and applying heat and pressure onto the superposed structure to form an electrode structure wherein the busbar and the metal member are physically and electrically connected to each other via the electroconductive layer.

According to the present invention, there is also provided a photo-electricity generating device, comprising: a semiconductor region, a transparent upper electrode disposed on the semiconductor region, and an electrode structure as described above formed on at least a portion of the transparent electrode as the substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
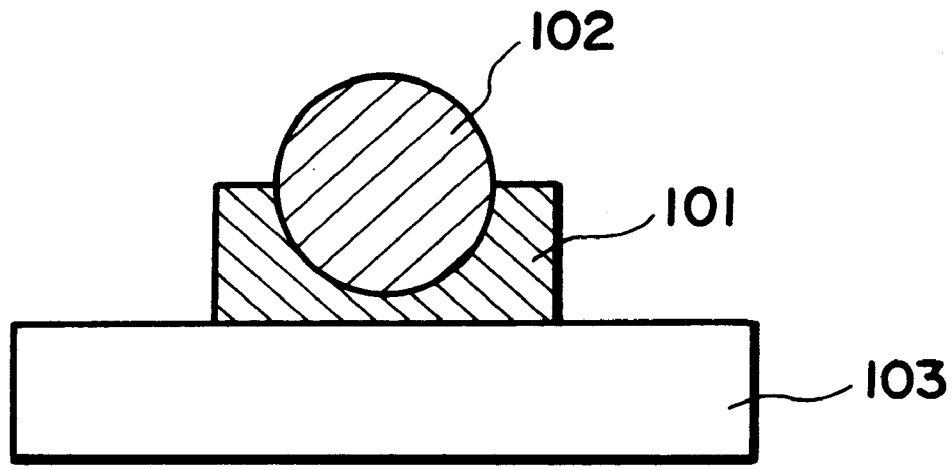
FIGS. 1A and 1B are sectional views of electrode structures according to the invention.

The electrode structure including an electroconductive layer according to the present invention is based on a discovery of a combination of species and compositions of an electroconductive filler and a polymeric resin giving good electricity collection performance and adhesion and is provided as a superposed structure including an electroconductive layer formed by dispersing at least one species of electroconductive filler in a polymeric resin, followed by shaping and drying.

The photo-electricity generating device according to the present invention includes a superposed collector electrode structure including an upper electrode also functioning as an anti-reflection layer, a metal member as a collector electrode, and an electroconductive layer having a higher resistivity than the collector electrode and disposed between the collector electrode and the upper electrode. As a result, it is possible to prevent difficulties, such as an increase in series resistance, a contact between upper and lower electrodes at a defect of the semiconductor layer leading to an initial period shunt, and also to provide an increased production yield. Further, an increased reliability is given by preventing metal migration which is liable to occur in a high temperature-high humidity environment during actual outdoor use, and also good electroconductivity and adhesion can be attained.

More specifically, by forming the electroconductive layer by shaping and processing in advance of a resinous composition, a strict viscosity control becomes unnecessary as required in electrode formation by using an electroconductive paint or paste. The shaping allows easy adjustment and control of the thickness. The patterning of the electrode can be performed accurately mechanically or by using a laser. A screen printing apparatus or like apparatus and tools become unnecessary. As a tack-free electroconductive layer can be formed, the alignment with a metal member (second electrode layer) can be freely effected, and any correction can be effected even if a deviation occurs, thus providing an electrode structure exhibiting good performances.

If the electroconductive layer is formed through thermosetting by using a curing or hardening agent, the resultant electroconductive layer is less affected by humidity, etc., thus providing an improved reliability in a long period of use in addition to the initial electroconductivity and adhesion.

By using an electroconductive filler having a number-average particle size of 0.01 $\mu$m to 5 $\mu$m, the electroconductive filler can exhibit good dispersibility in the electroconductive layer, thus providing an electrode structure showing good electroconductivity.

If a metal oxide is used as the electroconductive filler, the resultant electroconductive layer can have an increased light transmittance, so that it is possible to provide a photo-electricity generating device having an increased effective area.

By forming the electroconductive layer between a metal member and a busbar, the electroconductive layer material can sufficiently fill around stepwise elevations of the metal member and the busbar, thus providing an enhanced adhesion and improved initial and long-term electroconductivity.

By forming the busbar from a material having a lower resistivity than the metal member, a further increased electricity-collection performance can be attained.

If the busbar is formed from a metal having a lower resistivity than the metal member, the busbar can be formed at a good workability, thus allowing a structure and a shape providing a better electricity collection performance.

By forming a metal layer on the surface of the busbar, it becomes possible to improve the electrical connection and adhesion with the metal member and the electroconductive layer.

If at least a portion of the metal member is coated with an electroconductive paste, the adhesion of the metal member with the substrate can be facilitated, and an improved adhesion with the electroconductive layer is provided, thus providing a better adhesion between the metal member and the busbar.

If the bar-shaped or linear metal member is superposed on the electroconductive layer and then the superposed structure is subjected to heating and pressurization, it is possible to provide a structure exhibiting stronger adhesion and improved long-term reliability.

If the electroconductive is disposed in superposition between the collector electrode and the busbar, and then the superposed structure is subjected to heating and pressurization, the contact resistance at the electricity take-out portion can be lowered to provide a better electrical connection and improved long-term reliability.

As the bar-shaped or linear metal member is disposed on the electroconductive layer to provide an electrode structure, it is possible to provide a photo-electricity generating device which exhibits a high electricity collection performance, and a high reliability due to the electrode structure showing excellent adhesion in long-term use.

By forming the electroconductive layer between the bar-shaped or linear metal member and the busbar, the electrical connection between the metal member and the busbar is secured while obviating adverse influence of moisture and heat in long-term use, thus providing a photo-electricity generating device showing a high reliability.

Hereinbelow, some specific embodiments of the present invention will be described.

(Electrode structure)

(1) Structure

Figure 1B:
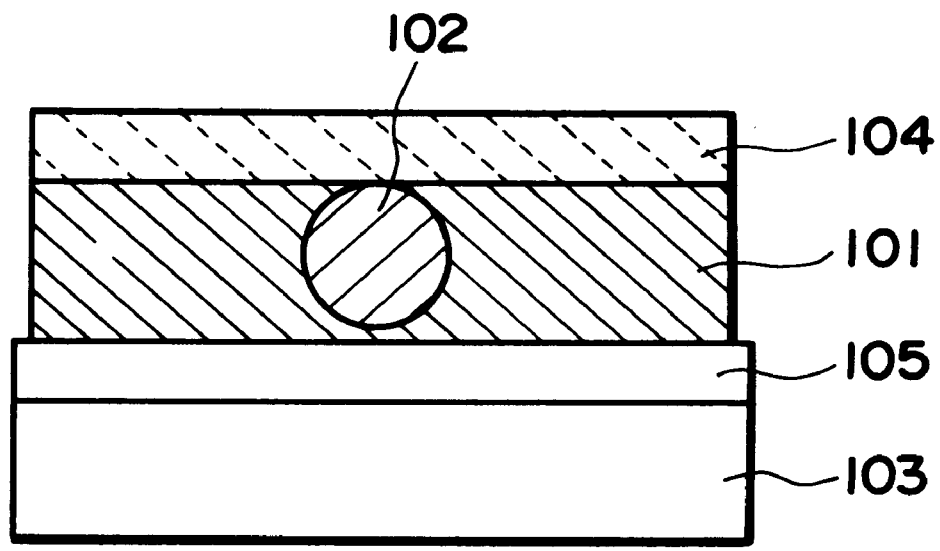

FIGS. 1A and 1B show basic electrode structures according to the present invention. Referring to FIG. 1A, the structure includes an electroconductive layer 101 as a first electrode, a metal member 102 as a second electrode and a substrate 103. On the other hand, FIG. 1B shows an electrode structure including an electroconductive layer 101 functioning as an adhesion layer between a metal member 102 and a busbar 104, a substrate 103, and an insulating layer 105.

The electroconductive layers 101 ensure both mechanical adhesion and electrical connection between the metal member 102 and the substrate 103 (FIG. 1A) or the busbar 104 (FIG. 1B). The electroconductive layer 101 refers to an electroconductive planar sheet or plate material and, before its formation into an objective electrode structure, can assume either a tacky adhesion tape or a tack-free sheet. Such a perform tape or sheet material may be preformed by casting of an electroconductive varnish in a mold, optionally followed by drying into a prescribed thickness, as shown in Examples appearing hereinafter, in order to effect a sufficient embedding of the metal member 102 in the electroconductive layer 101. In this case, it is preferred that the electroconductive layer 101 has a thickness sufficient to embed at least a portion, preferably at least 50%, of the metal member 102 therein.

As a preform material, it is also preferred to use a so-called "prepreg" material which is tack-free half-cured material, so as to provide a good handling characteristic and a tough adhesion in the product electrode structure.

Such a "prepreg" may generally be prepared by dissolving, e.g., an epoxy resin, a curing agent and a catalyst in a solvent to form a varnish, impregnating glass cloth with the varnish in a weight ratio of ca. 1:10 to 10:1 and passing the impregnated sheet through a drying apparatus to form a prepreg sheet in the B stage (half-cured solid prepreg state) wherein the epoxy resin has been reacted to some extent into oligomers which are linear or provided with some branches.

In the present invention, it is preferred to form an electroconductive prepreg sheet by using a varnish prepared by dispersing an electroconductive filler in a proportion of 5–95 wt. % of the resultant varnish by application of a manner of preparation of an electroconductive paste. The prepreg state conductive sheet exhibits good adhesion due to linear or branched oligomers contained therein and, during the heating and pressurization, is melted before curing to fill the gap around the stepwise elevation of the metal member or the busbar, thus finally providing an electrode structure wherein the cured polymeric resin well adheres to the metal member or the busbar with a good resistance to peeling.

It is possible to leave some tackiness to one or both surfaces of the prepreg sheet, as desired, so as to ensure a temporary adhesion with the metal member 102 or the busbar 104.

The electroconductive layer 101, when used as a first electrode as show in FIG. 1A, may preferably have an appropriate level of resistivity (or specific resistance) which does not adversely affect the electricity collection from the substrate of, e.g., a photo-electricity generating device but provides an appropriate level of resistance for obviating the shunt or short circuit even when the substrate is accompanied with a defect. More specifically, the resistivity may preferably be at a level of 0.01–100 ohm.cm. Before 0.01 ohm.cm, the barrier function for alleviating the shunt is liable to be insufficient and, above 100 ohm.cm, the electrical loss is liable to be increased.

The electroconductive layer 101, when used as an adhesive layer between the metal member 102 and the busbar, may preferably have as low a resistivity as possible, e.g., 0.1–40 ohm.cm, more preferably 0.2–10 ohm.cm.

The metal member 102 functions as a collector electrode and may desirably have a low resistivity. More specifically, the metal member 102 may preferably comprise a metal having a resistivity of at most $10^{-4}$ ohm.cm, and suitable examples thereof may include: copper, silver, gold, platinum, aluminum, molybdenum and tungsten, which show a low electrical resistivity and are wire materials commercially stably supplied. Alloy of these metals may also be used. It is possible to surface-coat the metal member 102 with a metal layer having a thickness of e.g., 0.1–10 % of the diameter of the metal member for the purpose of anti-corrosion, anti-oxidation, improvement in adhesion and electrical connection with the electroconductive layer 101, etc. The sectional shape of the metal member may be either circular or rectangular.

Further, in the case where the electroconductive layer 101 is used as an adhesive layer between the metal member 102 and the busbar 104 as shown in FIG. 1B, it is preferred to surface-coat at least a portion of the metal member 102 with an electroconductive paste so as to facilitate the adhesion between the metal member 102 and the substrate 103 and to improve the adhesion with the electroconductive layer 101, thus ensuring an adhesion between the metal member 102 and the busbar 104.

The busbar 104 is a conductor for further collecting the electricity collected from the device by the electroconductive layer 101 and the metal member 102. Similarly as the metal member 102, the busbar 104 may preferably comprise a low-resistivity material, suitable examples of which may include: copper, silver, gold, platinum, aluminum, tin, lead, nickel, and alloys of these metals. The shape of the busbar 104 may for example be either tab-shaped or linear.

In the case where the electroconductive layer 101 is used as an adhesive layer between the metal member 102 and the busbar 104, the busbar 104 may preferably comprise a material having a lower resistivity than the metal member 102 so as to exhibit a higher electricity collection performance. Further, if the busbar 104 comprises a metal having a lower resistivity than the metal member 102, the busbar 104 can be formed in a structure and a shape suitable for enhancing the electricity collection performance. Further, it is also preferred to surface-coat the busbar 104 with a metal layer so as to improve the electrical connection and adhesion with the metal member 102 and the electroconductive layer 101.

(2) Electroconductive filler

In the present invention, the electroconductive filler may suitably comprise electroconductive carbon black or a metal oxide, such as a metal oxide conductor or semiconductor in case where transparency is required.

As the electroconductivity can be changed if the powdery fine structure is broken during the processing of the electroconductive carbon black, the electroconductive carbon may preferably be formed in a hollow shell shape and comprise a carbon material having a high degree of graphitization, such as acetylene black. Examples of the metal oxide may comprise ultra-fine powder of metal oxide conductor or semiconductor, such as $In_2O_3$, $SnO_2$, Sb-doped $SnO_2$, $TiO_2$, CdO or ZnO. Two or more species of the electroconductive filler can be used in mixture.

These electroconductive filler materials may exhibit a resistivity (specific resistance) on the order of $10^{-4}$ ohm.cm to $10^{-1}$ ohm.cm in their bulk state. The shape of the electroconductive filler particles may affect the electroconductivity and may preferably be flaky rather than spherical so as to stably provide a three-dimensional connection. The number-average particle size may preferably be 0.01–5 $\mu$m so as to provide a low-resistivity electroconductive layer because of a high dispersibility.

(3) Polymeric resin

The polymeric resin used in the present invention functions to bind and hold the electroconductive filler and protect the filler from moisture. A preferred example thereof is a thermosetting resin forming a stable B-stage state. In the B-stage, the resin component is partially reacted to exhibit a solid state at room temperature, thus being able to provide a sheet or film shape. Suitable examples thereof may include epoxy resin and imide resin. An appropriate curing or hardening agent and, if desired, further a hardening catalyst may be added. It is preferred to add a solvent in order to provide a viscosity suitable for the dispersion of the filler.

The hardening agent may be selected together with the reaction condition so as to react with the thermosetting resin to form linear or branched oligomers. In view of the pot life, a diamine-type hardener is suitably used.

(4) Formation of the electroconductive layer

After dispersion of the above-mentioned materials, the dispersed composition may be formed into a sheet or film by impregnating a sheet or film form of, e.g., glass fiber, followed by thickness adjustment and passing through a drying apparatus. The sheet or film form composition thereafter may be cut into a desired pattern of the electrode or the busbar, for example, by laser cutting suitable for a fine pattern cutting.

(Photoelectricity-generating device)

Some suitable structures of the photo-electricity generating device will now be described with reference to drawings.

(First Embodiment)

Figure 2:
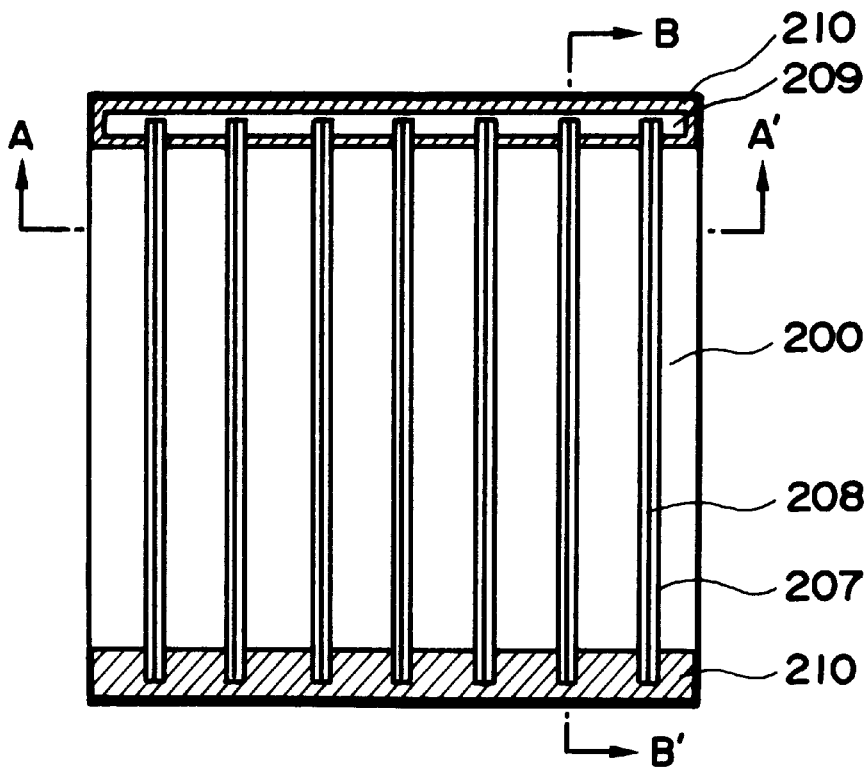
FIG. 2 is a schematic plan view from a light incidence side of a photo-electricity generating device according to the invention.
Figure 3:
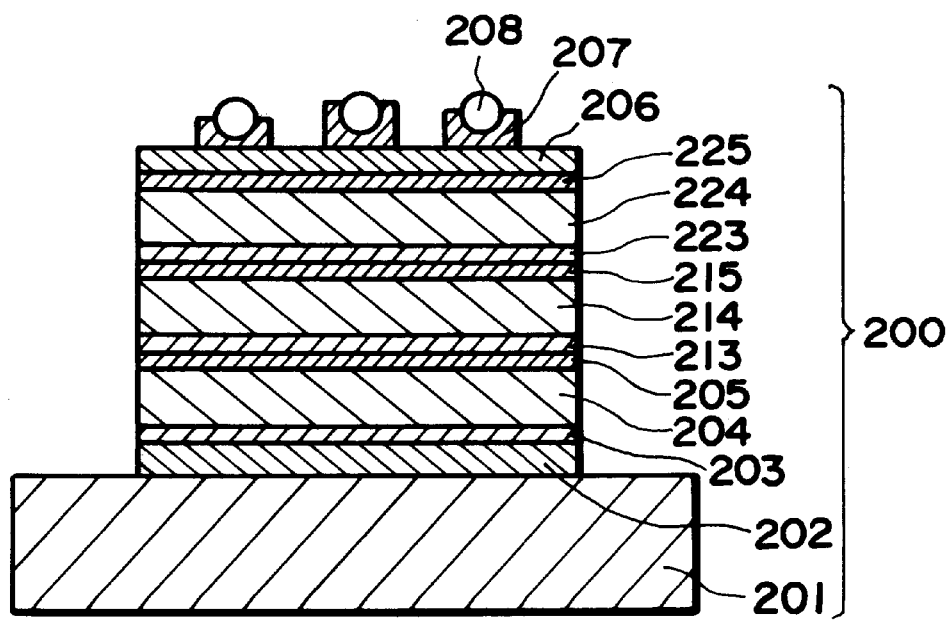
FIGS. 3 and 4 are sectional views taken along A–A' line and B–B' line, respectively, in FIG. 2.
Figure 4:
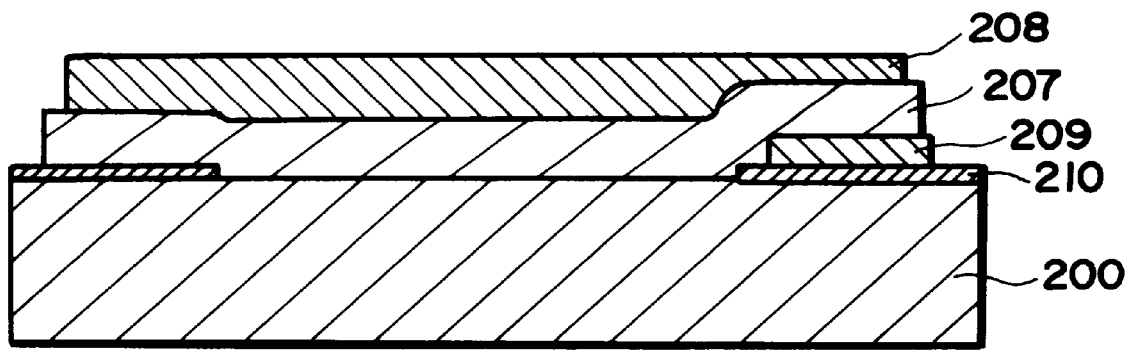

FIG. 2 is a schematic plan view from a light incidence side of an amorphous silicon photo-electricity generating device having a triple stacked structure and including the electroconductive layer as a first electrode, and FIGS. 3 and 4 are schematic views taken along line A–A' and line B–B', respectively, in FIG. 2. The device is designed to be exposed to light incident to the device from a side opposite to a substrate 201.

Referring to FIGS. 2–4, a photo-electricity generating device includes a device base structure 200, on which are disposed an electroconductive layer 207 as a first electrode, a metal member 208 as a second electrode, a busbar 209, and an insulating layer 210. As shown in FIG. 3, the device base structure 200 has an internal layer structure including a device substrate 201, a lower electrode 202, n-layers 203, 213 an 223, i-layers 204, 214 and 224, p-layers 205, 215 and 225, and an upper electrode 206. The internal layer structure is omitted from showing in FIG. 4, and the device base structure is inclusively represented by a numeral "200" in FIGS. 2 and 4.

(1) A first electrode is generally required to have a higher resistivity than a second electrode but exhibit a level of resistance not adversely affecting the efficiency of photo-electricity generating device. In order to satisfy the requirement, the electrode structure according to the present invention including an electroconductive layer 207 as the first electrode may suitably be used. Thus, the electroconductive layer 207 as the first electrode is a high resistivity layer preventing the shunt and functions as a resistance at a defect to prevent a large leakage while not providing a substantial resistance for a current generated by the photo-electricity generating device.

The first electrode and the upper electrode are generally required to have an ohmic characteristic. The electroconductive layer 207 contains an oxide (semi)conductor or electroconductive carbon as a filler but is suitably used as the first electrode because of its degenerate state.

The electroconductive layer 207 as the first electrode may have an appropriate resistance value determined based on grid design, a current value of the photo-electricity generating device at its operation point, a defect size, etc. For example, in case of a 10 μm-thick layer, an appropriate level of resistance may be provided by setting its resistivity to a level of 0.1–100 ohm.cm for providing a sufficient shunt-preventing resistance and substantially not adversely affecting the generated current.

The electroconductive layer 207 as the first electrode may desirably have a thickness of ca. 5–100 μm. A thickness of at least 5 μm is preferred for adhering to and supporting the metal member 208 as the second electrode and for functioning as a barrier to moisture. A thickness in excess of 100 μm is liable to impair the flexibility.

(2) The metal member 208 as a second electrode or a grid electrode used in the present invention is an electrode for taking out electricity generated in the semiconductor layer. The metal member 208 as the second electrode is formed in a comb-shape, of which the width and pitch may be determined based on the sheet resistivities of the semiconductor layer and the upper electrode 206. The metal member 208 desirably has a low resistivity so as not to provide a substantial series resistance in the photo-electricity generating device, desirably on the order of $10^{-2}$ ohm.cm–$10^{-6}$ ohm.cm.

The metal member 208 may suitably comprise copper, chromium, nickel or aluminum and may preferably be formed in a linear or bar shape having a width or diameter of 50–200 μm. The metal member 208 may be arranged so as to provide a spacing of, e.g., 5 mm each. In order to improve the moisture resistance or adhesiveness, it is possible to coat the surface of the metal member 208 with an alloy plating or with an electroconductive paste containing a filler, such as a metal oxide, which is less affected by moisture. The metal member 208 may have a sectional shape which is not only circular but also has a flat portion or a concavity.

(3) The substrate 201 is a member for mechanically supporting a layer of a semiconductor, such as amorphous silicon, of a photo-electricity generating device. The substrate 201 can also function as an electrode in some cases. The substrate 201 is required to have a heat resistance durable against the heating for formation of the semiconductor layer and can comprise either an electroconductive or an electrically insulating material.

Examples of the electroconductive material may include: metals, such as Fe, Ni, Cr, Al, Mo, Au, Nb, Ta, V, Ti and Pt, and alloys of these metals, such as brass and stainless steel. These materials may be used in a thin sheet form or a composite thereof. Other materials may include carbon sheet and zinc-plated steel plate.

Examples of the electrically insulating material may include: films or sheets of heat-resistant synthetic resin, such as polyester, polyethylene, polycarbonate, cellulose acetate resin, polypropylene, polyvinyl chloride, polyvinylidene chloride, polystyrene, polyamide, polyimide and epoxy resin, and composites thereof with glass fiber, carbon fiber, boron fiber or metal fiber. These materials may further be coated with another metal film and/or a film of an insulating material, such as $SiO_2$, $Si_3N_4$, $Al_2O_3$ or AlN by sputtering, vapor deposition or plating. Other insulating material may include sheets of glass or ceramics.

(4) The lower electrode 202 is an electrode on one side for taking out electricity generated from the semiconductor layer and is required to have a work function suitable for providing an ohmic contact with the semiconductor layer. The lower electrode 202 may comprise a metal, an alloy or a transparent conductive oxide, examples of which may include: Al, Ag, Pt, Au, Ni, Ti, Mo, W, Fe, V, Cr, Cu, stainless steel, brass, nickel-chrome alloy, $SnO_2$, $In_2O_3$, ZnO and ITO.

The lower electrode 202 may have a surface which is suitably flat but can be textured so as to cause random reflection of light. When the substrate 201 is electroconductive, the lower electrode 202 can be omitted.

The lower electrode 202 may be formed by plating, vapor deposition, sputtering, etc., selected as desired.

(5) The semiconductor layer of the photo-electricity generating device used in the present invention may comprise amorphous silicon, polycrystalline silicon, single-crystal silicon, etc.

In an amorphous silicon photo-electricity generating device, the i-layers 204, 214 and 224 may comprise so-called group IV or groups IV alloy semiconductor inclusive of a-Si:H, a-Si:F, a-Si:H:F, a-SiGe:H, a-SiGe:f, a-SiGe:H:F, a-SiC:H, a-SiC:F, and a-SiC:H:F.

The n-layers 203, 213 and 223 or p-layers 205, 215 and 225 may comprise a semiconductor material obtained by doping the semiconductor material constituting the above-mentioned i-layers 204, 214 and 224 with a valence electron controller. The valence electron controller may comprise a compound containing a group III element according to the periodic table for obtaining a p-type semiconductor. Examples of the group III element may include: B, Al, Ga and In. The valence electron controller for obtaining an n-type semiconductor may comprise a compound containing a group V element according to the periodic table. Examples of the group V element may include: P, N, As and Sb.

(6) Amorphous silicon semiconductor layers may be formed through a known process, such as vapor deposition, sputtering, RF plasma CVD process, microwave plasma CVD process, ECR process, thermal CVD process, or LPCVD process, selected as desired. It is commercially preferred to use the RF (radio frequency) plasma CVD (chemical vapor deposition) process wherein a starting gas decomposed by RF plasma to cause a deposition on the substrate. The RF plasma CVD process is accompanied with difficulties such that the starting gas decomposition efficiency is as low as ca. 10%, and the deposition speed is as slow as ca. 1 Å/sec. to 10 Å/sec. These difficulties may be alleviated by the microwave CVD process. The semiconductor layer forming reaction may be performed in a known batchwise or continuous film forming apparatus.

The photo-electricity generating device according to the present invention may be realized not only as a cell having a single pin semiconductor junction structure but also as a tandem cell or a triple cell (as shown in FIG. 3) having two or more stacked layers of semiconductor junction structures.

(7) The upper electrode 206 is an electrode for taking out electricity generated in the semiconductor layer(s) in cooperation with the lower electrode 202. The upper electrode 206 is required in the case of using a semiconductor having a high sheet resistivity like amorphous silicon and unlike the case of a photo-electricity generating device using a crystalline semiconductor showing a low sheet resistivity. The upper electrode 206 is required to be transparent since it is disposed on the light incidence side and is therefore also called a transparent electrode.

The upper electrode 206 may desirably exhibit a light transmittance of at least 85% so as to have the semiconductor layer effectively absorb the light from sun or white luminescent lamps and, from an electrical viewpoint, may desirably show a sheet resistivity of at most 100 ohm/square so as to flow a photo-generated current in a lateral direction parallel to the semiconductor layer. As materials satisfying such properties, it is possible to use a metal oxide, such as $SnO_2$, $In_2O_3$, ZnO, CdO, $CdSnO_4$, or ITO ($In_2O_3+SnO_2$).

The upper electrode 206 may be formed by resistance-heated vapor deposition, electron beam-heated vapor deposition, sputtering or spraying, selected as desired.

(8) The busbar 209 used in the present invention is an electricity collection member for further collecting currents passing through the electroconductive layer 207 as the first electrode and the metal member 208 as the second electrode at one end of the device. The busbar 209 may comprise a metal, such as Cu, Ag or Pt, or an alloy of these metals. The busbar may be formed in a sheet, a tape or a foil, and applied with an adhesive, etc.

Further, an insulating layer 210 is disposed at edges of the device base structure 200 so as to prevent the short circuit of the grid electrode and the electricity-collection member with the lower electrode or the substrate. The insulating layer 210 may preferably comprise a tape of an insulating material, preferably of polyimide or polyester, for example, provided with an adhesive applied on its lower side.

(Second and Third Embodiments)

Figure 5:
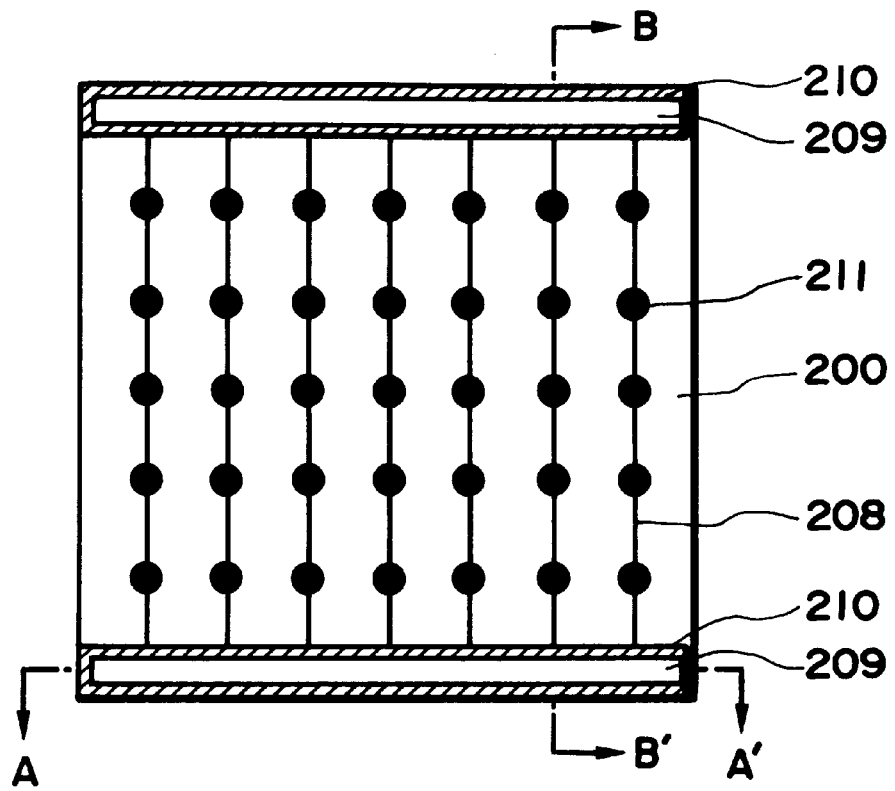
FIG. 5 is a schematic plan view from a light incidence side of another photo-electricity generating device according to the invention.
Figure 6:
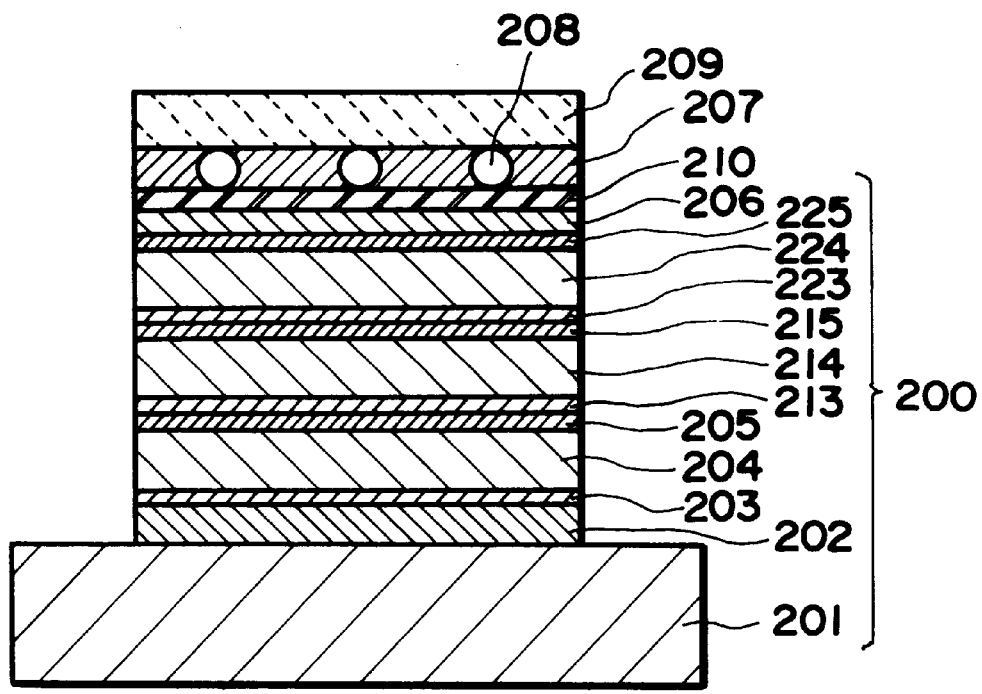
FIGS. 6 and 7 are sectional views taken along A–A' line and B–B' line, respectively, in FIG. 5.
Figure 7:
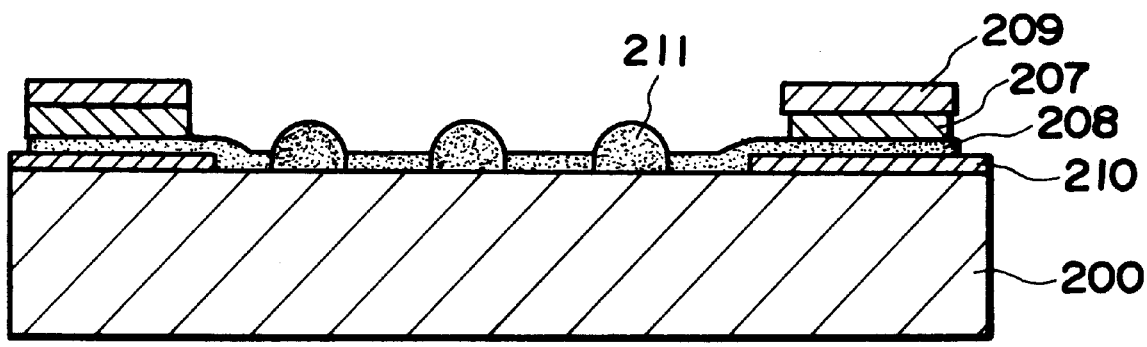
Figure 8:
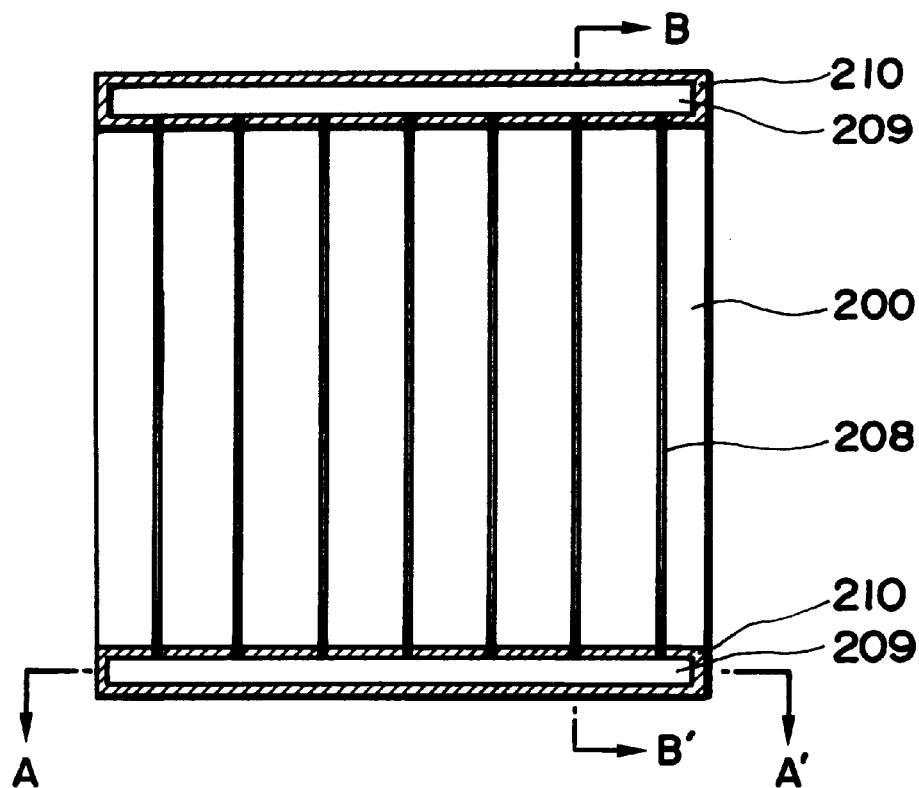
FIG. 8 is a schematic plan view from a light incidence side of a photo-electricity generating device according to Example 4.
Figure 9:
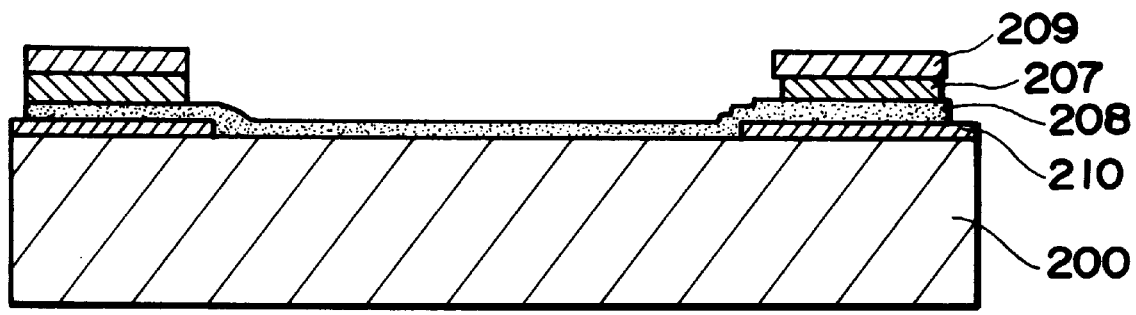
FIG. 9 is a sectional view taken along B–B' line in FIG. 8.

FIGS. 5 and 8 are schematic plan views from a light incidence side of amorphous silicon photo-electricity generating devices according to Second and Third Embodiments, respectively, wherein an electroconductive layer 107 is disposed as an adhesive layer between a metal member 208 and a busbar 209. Each has a triple stacked structure having the light incidence side opposite to the substrate. FIGS. 6 and 7 are schematic sectional views taken along A–A' line and B–B' line, respectively, in FIG. 2. FIG. 9 is a schematic sectional view taken along B–B' line in FIG. 8. In FIGS. 7 and 9, the internal layer of each device base structure 200 is omitted from showing.

Second and Third Embodiments shown in FIGS. 5 and 8, respectively, are different from First Embodiment described above in the following respects, and other points are basically similar as in First Embodiment.

In Second Embodiment shown in FIGS. 5–7, an electroconductive layer 207 is disposed between a metal member 208 and a busbar 209 so as to mechanically and electrically convert these members. The electroconductive layer 207 may suitably have a low resistivity on the order of desirably 0.001 ohm.cm to 1.0 ohm.cm. The electroconductive filler may comprise a metal or a metal oxide, but may suitably comprise an oxide (semi)conductor or electroconductive carbon so as to prevent the shunt or short circuit liable to be caused by electromigration due to interaction of metal ions with moisture water. The electroconductive layer 207 may desirably have a thickness which is larger than the diameter or thickness of the metal member 208 so as to fully embed the metal member 208 therein and connect the metal member to the busbar 209. In order to provide a secure connection between the metal member 208 and the busbar 209, it is preferred to apply heat and pressure from above the busbar 209 for promoting the bonding.

In order to promote the mechanical and electrical connection of the metal member 208 with the device base structure 200, dots 211 of an electroconductive adhesive material are formed at equal spacings in Second Embodiment (as shown in FIGS. 5 and 7), and the entire periphery or the lower part of the metal members 8 is coated with an electroconductive adhesive material in Third Embodiment shown in FIG. 8, followed by bonding under application of heat and/or pressure.

The electroconductive adhesive material for providing dots 211 or coating the metal members 208 may suitably be obtained by dispersing an electroconductive filler, such as electroconductive carbon black, graphite or metal oxide, in a polymeric resin. The dots 211 in FIG. 5 may comprise a thermosetting resin to be heat-cured. The coating on the metal members 208 in FIG. 8 may comprise a thermoplastic resin or a thermosetting resin brought to a half-cured state by using a block isocyanate curing agent, followed by bonding under application of heat and/or pressure. In order to minimize the electrical loss and exhibit a barrier function when directly disposed at a shunt portion, the electroconductive adhesive material may preferably have a resistivity of 0.01 ohm.cm to 100 ohm.cm.

Further, in order to reduce the optical shadow loss, the dots 211 may preferably have a diameter in the range of 0.5 mm to 2.0 mm. An appropriate dot spacing may be determined depending on the diameter so as not impair the adhesion. Further, the metal members 8 may suitably be coated with the electroconductive adhesive material in a thickness of ca. 5–30 $\mu$m, so as to reduce the electrical loss and optical shadow loss while ensuring the adhesion.

As described above and otherwise similarly as in First Embodiment, photo-electricity generating devices may be produced by forming electricity collection parts on device base structures 200 similar to the one used in First Embodiment.

(Module)

A photo-electricity generating device prepared in the above-descried manner may be encapsulated into a module structure in a known manner in order to provide better weatherability and mechanical strength in outdoor use. The encapsulation material may suitably comprise EVA (ethylene-vinyl acetate copolymer) as an adhesive layer material in view of adhesiveness with the photo-electricity generating device, weatherability and cushioning effect.

In order to improve the moisture resistance and the scratch resistance, the encapsulation material may include a surface layer comprising a fluorine-containing resin. Examples of the fluorine-containing resin may include: polytetrafluoroethylene (e.g., "TEFLON" available from DuPont), tetrafluoroethyleneethylene copolymer (e.g., "TEFZEL" available from DuPont), polyvinyl fluoride (e.g., "TEDLAR", available from DuPont), and polychlorofluoroethylene (e.g., "NEOFLON", available from Daikin K. K.). It is possible to add a known ultraviolet absorber into these resins so as to improve the weatherability.

The encapsulation may desirably be performed by using a known apparatus, such as a vacuum laminator, to effect a heat-pressure bonding of the photo-electricity generating device and the above-mentioned encapsulating resinous film material in vacuum.

EXAMPLES

Now, the electrode structure and the solar cell including the electroconductive layer will be described based on specific Examples, to which the present invention should not be construed as being restricted.

Example 1

A photo-electricity generating device base structure 200 having a pin-junction triple-stacked amorphous semiconductor structure as shown in FIGS. 2–4 an having a grid length of 30 cm was prepared in the following manner by using the microwave plasma CVD process for forming the amorphous semiconductor structure.

First, a substrate 201 was provided with a lower electrode 202 comprising an Ag layer and a ZnO layer, and then placed in a microwave plasma CVD process to form an n-layer 203, an i-layer 204 of a-SiGe and a p-layer 205 by deposition in this order to form a bottom layer. Then, deposition was performed in the order of an n-layer 213, an i-layer 214 of a-SiGe similarly as in the bottom layer and a p-layer 215 to form a middle layer. Then, deposition was performed in the order of an n-layer 223, an i-layer 224 of a-Si and a p-layer 225 to form a top layer. Then, a 700 Å-thick transparent upper electrode 206 of ITO also functioning as an anti-reflection layer was formed by deposition to provide a device base structure 200.

Then, an electroconductive sheet for providing an electroconductive layer according to the present invention was prepared in the following manner.

First, 55 wt. parts of electroconductive carbon powder having an average particle size of 0.5 μm (as electroconductive filler), 40 wt. parts of brominated bisphenol A resin (as binder), 5 wt. parts of dicyandiamide (as hardener) and 30 wt. parts of n-butylcellosolve acetate ("BCA", as solvent) were kneaded by a three-roll mill to form an electroconductive paste.

The above-prepared electroconductive paste was cast into a mold in a controlled thickness and placed in a drying apparatus for 1 hour to form a 150 μm-thick electroconductive sheet. Then, the electroconductive sheet was patterned into a comb-shaped 200 μm-wide electroconductive layer 207.

By using the thus-prepared patterned electrode sheet, a photo-electricity generating device having a superposed electrode structure according to the present invention was prepared as follows.

At opposite edge of the above-prepared device base structure 200, 7 μm-wide polyimide tapes as insulating members 210 were applied with an adhesive and, on one of the polyimide tapes 210, a busbar 209 was fied with an adhesive. Then, so as to cover the busbar 209 and the polyimide tapes 210, the above-prepared comb-shaped patterned electrode sheet 207 was disposed, and metal members 208 of 100 μm-dia. copper wires were superposed on the patterned electrode sheet at a pitch of ca. 5 mm. Then, the entire superposed structure was held at 160° C. for 30 min. under a pressure of 15 kg.f by a hot-press machine to form a photo-electricity generating device, havingn a superposed electrode structure formed thereon.

In the above-described manner, 20 device samples were prepared and evaluated in the following manner.

Among the samples, 10 samples (referred to as "S-1 sample(s)" were examined with respect to electrode performances. S-1 sample exhibited a good adhesion force between the composite electrode (207 and 208) and the base structure 200 of 650 g-f 1200 μm-width in a direction perpendicular to the adhesion boundary as measured according to JIS K6848 and a specific resistance of 12 ohm.cm between the base structure and the electrode as measured according to the four terminal method. When the boundaries at elevations of the busbar 209 and the insulating layer 210 at the device edge were observed through a microscope, whereby the electroconductive layer was filled also into the elevations.

The S-1 samples were subjected to a moisture resistance test in the following manner.

Figure 10:
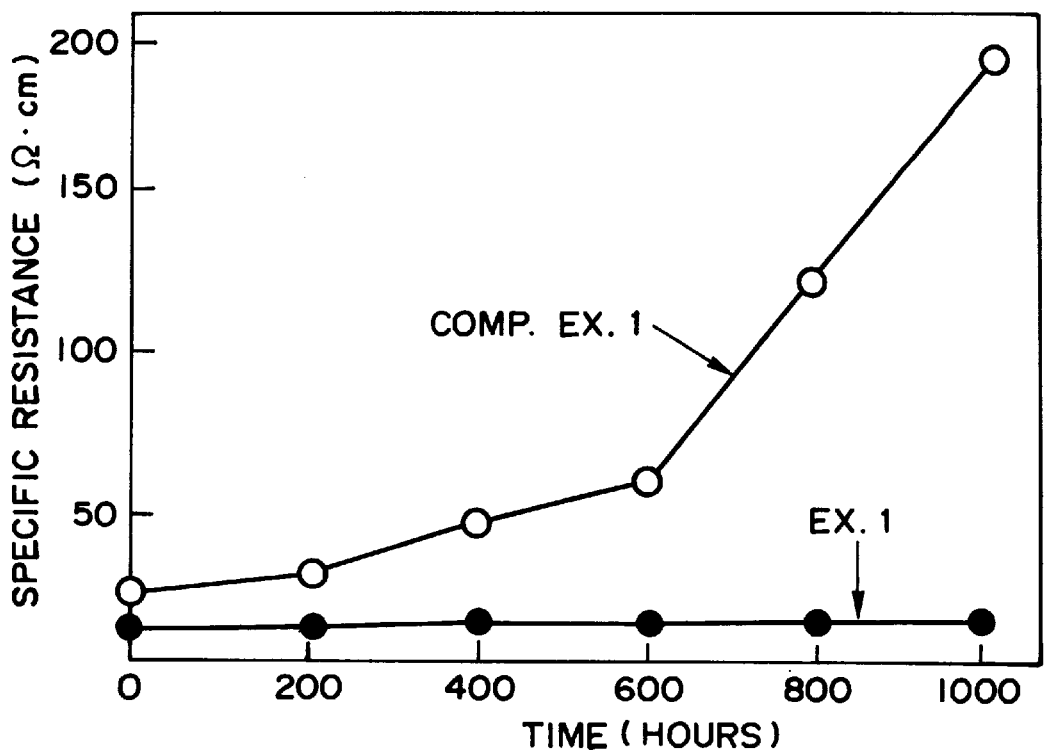
FIG. 10 is a graph showing resistivity changes of multi-layer electrodes in a high temperature-high humidity test.

Based on a high temperature—high humidity test according to JIS C0022, S-1 sample was left standing in an environment of temperature 85° C. and humidity 85% RH for 1000 hours and then subjected to measurement of a specific resistance between the base structure and the composite electrode according to the four terminal method, whereby the S-1 sample showed a specific resistance of 12.8 ohm.cm showing substantially no change after the standing for 1000 hours as shown in FIG. 10. As a result of the adhesions strength test, no adhesive force change was observed.

The remaining 10 samples (referred to as "S-2 sample(s)") were examined with respect to solar cell performances after encapsulation in the following manner. Each S-2 sample (photo-electricity generating device) was sandwiched between a pair of EVA films placed above and below the sample and then further sandwiched with a pair of ethylene-tetrafluoroethylene copolymer films ("TEFZEL", available from Dupont). Then, the sandwiched product was placed in a vacuum laminator to be held at 150° C. for 60 min. to effect vacuum lamination.

The initial stage performance of the samples was evaluated as follows.

The samples were subjected to measurement of a voltage-current characteristic in the dark state to obtain a shunt resistance based on a slope around the original, thereby showing 185 kohm.cm$^2$–275 kohm.cm$^2$ which were evaluated as good and little fluctuation. Then, S-2 samples were subjected to measurement of solar cell performances by using a solar simulator (available from SPIRE Co.) issuing a light intensity of 100 mW/cm$^2$ with a solar light spectrum of AM1.5 global, thereby showing conversion efficiencies of 9.1%±0.5% and an average series resistance of 30.2 ohm.cm$^2$ which were evaluated as good an little fluctuation.

S-2 samples were subjected to a temperature—moisture cycle test A-2 stipulated in an environmental test and a durability test for crystalline solar cell modules according to JIS C8917, as a reliability test.

Figure 11:
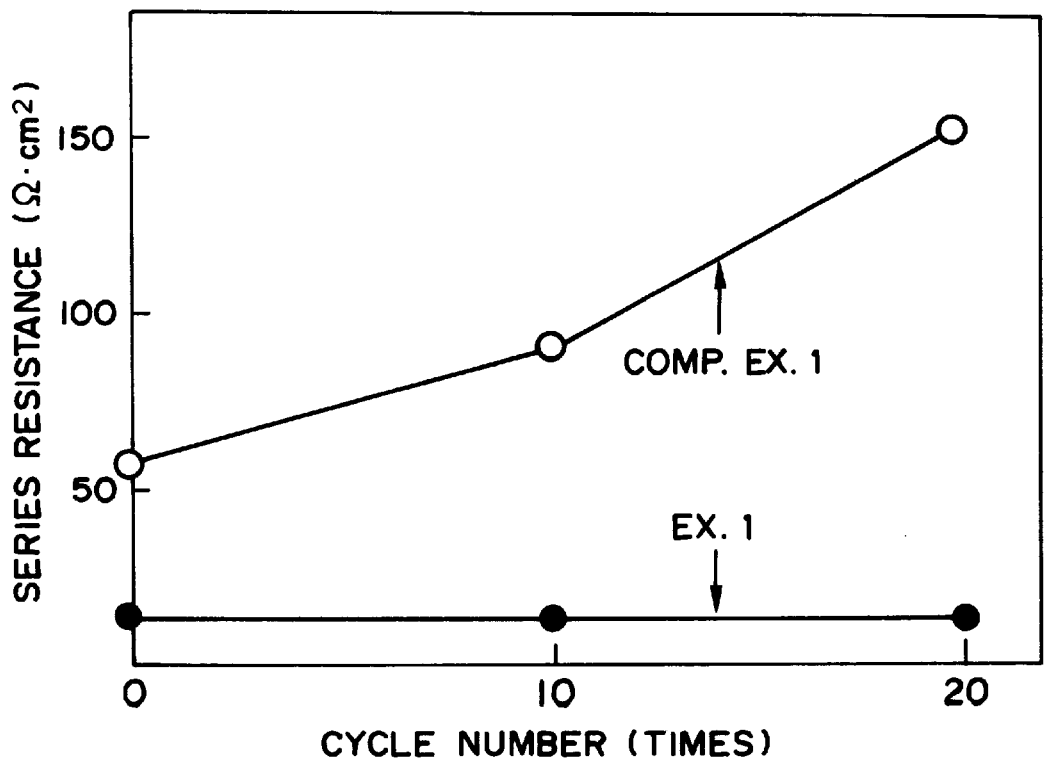
FIG. 11 is a graph showing series resistance changes of solar cells after a temperature-humidity cycle test.
Figure 12:
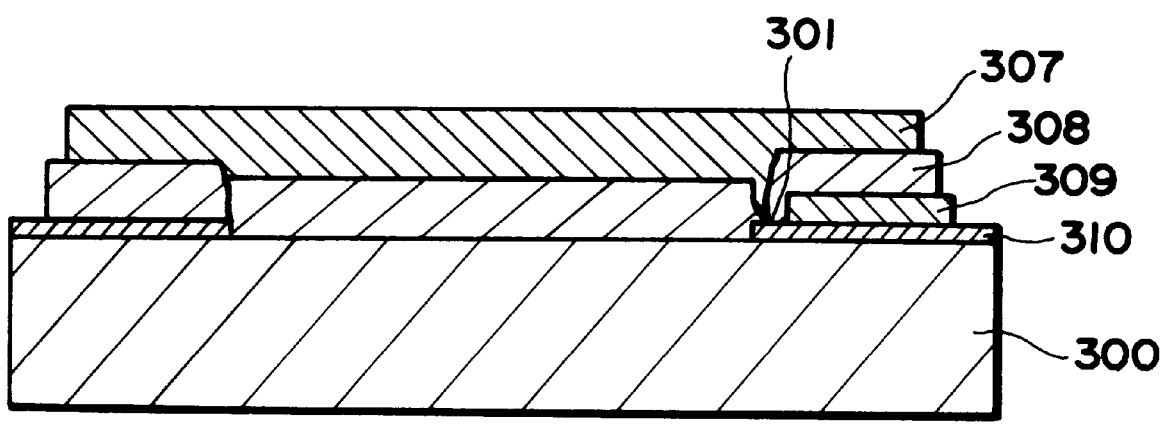
FIG. 12 is a schematic sectional view of an electrode side portion of a known photo-electricity generating device.

S-2 samples were placed in a constant temperature-humidity vessel of which the temperature and humidity could be controlled to environmental changes of 20 cycles each including a change between −40° C. and +85° C. (85% RH), and the samples were measured with respect to solar cell performances using the solar simulator similarly as the initial stage, thereby showing a decrease of 1% on an average compared with the initial stage conversion efficiency, which was not evaluated as a significant degree of deterioration. Further, as a result of the series resistance measurement, S-2 samples showed a result as shown in FIG. 11 indicating an increase of 5% on an average compared with the initial stage series resistance. Further, S-2 samples showed a decrease in shunt resistance of ca. 8% on an average thus being evaluated as free from significant deterioration.

From the results shown in the above example, the photo-electricity generating device using the electrode structure according to the present invention could be produced at a good yield and provided with good performances, thus showing a good reliability.

Comparative Example 1

For the purpose of comparison, a superposed or laminate electrode structure was prepared and incorporated in a solar cell in a conventional manner.

To the same species and amounts of electroconductive filler and binder as used in Example 1, 30 wt. parts of phenolic resin (as hardener) and 30 wt. parts of BCA were added and kneaded together by a three roll mill to form an electroconductive paste.

The above-prepared electroconductive paste was applied by a screen printer onto a photo-electricity generating device base structure 200 including up to an upper electrode 206 prepared in the same manner as in Example 1, and the 100 $\mu$m-dia. copper wires were placed thereon. The structure was placed in a hot air oven and held at 160° C. for 30 min. to form a superposed electrode structure, followed by connection with a busbar to form a single-cell photo-electricity generating device of 30 cm×30 cm-square.

In this manner, 20 device samples for comparison were prepared and evaluated in the same manner as in Example 1.

More specifically, among the 20 samples, 10 samples (R-1 sample(s)) were evaluated with respect to electrode performances similarly as in Example 1, whereby R-1 samples showed an adhesion force of 50 g-f and a specific resistance of 200 ohm.cm. Further, as a result of observation through a microscope, cracks were found at boundaries of the electrode with elevation of the busbar and the insulating layer at the edge.

As a result of the moisture resistance test, R-1 samples showed a specific resistance which increased with time.

Then, the remaining 10 samples (R-2 samples) were examined with respect to solar cell performances after encapsulation in the same manner as in Example 1, whereby the encapsulated R-2 samples exhibited conversion efficiencies of 7.8%±2.5% and series resistances ranging from 50 ohm.cm$^2$ to 80 ohm.cm$^2$ and giving an average of 66.3 ohm.cm$^2$ as initial stage performances, thus showing a higher series resistance and accordingly a lower conversion efficiency with a larger fluctuation than in Example 1.

Further, the encapsulated R-2 samples were subjected to a temperature-humidity test as a reliability test in the same manner as in Example 1. As a result of solar cell performance evaluation after the temperature-humidity cycle test, the R-2 samples (Comp. Ex. 1) exhibited a change with time of series resistances as shown in FIG. 11 indicating a clear increase after 10 cycles and an increase up to 150 ohm.cm$^2$ on an average after 20 cycles, indicating a lower in contact intimacy between the electrodes.

Example 2

Electrode structure and photo-electricity generating device samples were prepared in the same manner as in Example 1 except for using ITO powder having an average particle size of 0.2 $\mu$m as electroconductive filler.

The resultant device samples were encapsulated and then evaluated in the same manner as in Example 1.

As a result of the initial stage performance evaluation, the encapsulated samples exhibited an average shunt resistance of 200 kohm.cm$^2$ and good conversion efficiencies of 9.3%±0.2. The electroconductive layers 207 as the first exhibited a good optical transmittance in a wavelength region of 400–800 nm contributing to a current increase.

As a result of the reliability test, the encapsulated device samples showed a series resistance increase of ca. 5% after the temperature-humidity cycle test.

Example 3

A photo-electricity generating device having a pin-junction triple-stacked structure having a structure as shown in FIGS. 5–7 and having a grid length of 30 cm was prepared in the following manner by using a base structure 200 including up to an upper electrode 206 prepared in the same manner as in Example 1.

On the device base structure 200, 100 $\mu$m-dia. copper wires as metal members 208 were placed and fixed by an adhesive at the edge of a 7 mm-wide polyimide tape as an insulating layer 210. Then, an electroconductive sheet prepared in the same manner and cut into a width of 5 mm was placed as an electroconductive layer 207 on end portions of the metal members 208 located outside the active area of the device so as to sandwich the end portions together with the insulating layer 210.

Then, a 6 mm-wide copper foil as a busbar was placed on the electroconductive layer 207, and a heat and a pressure were applied from above the busbar 209 by a hot press similarly as in Example 1 to effect the electrode bonding. Then, for bonding of the metal members 208 in the active area, dots 211 of 1.0 mm in diameter and 0.5 mm in thickness were formed by application of a carbon paste through a syringe, and then the structure was held in a hot air oven at 160° C. for 30 min. for effecting the bonding. Incidentally, the carbon paste was prepared as an electroconductive paste by kneading 25 wt. parts of carbon black, 65 wt. parts of urethane resin, 10 wt. parts of block isocyanate and 80 wt. parts of a mixture solvent of IPA and ethyl acetate by a paint shaker.

The electroconductive layer 207 showed a resistivity of 0.3 ohm.cm and the busbar 209 showed a resistivity of 1.55×10$^{-6}$ ohm.cm.

The above-prepared device samples were encapsulated and then evaluated in the same manner as in Example 1.

As a result of the initial stage performance evaluation, the encapsulated samples exhibited an average shunt resistance of 200 kohm.cm$^2$ and good conversion efficiencies of 9.3%±0.2%.

As a result of the reliability test, the encapsulated device samples showed a good series resistance increase of ca. 4.7% after the temperature—humidity cycle test.

Example 4

A photo-electricity generating device having a pin-junction triple-stacked structure having a structure as shown in FIGS. 8 and 9 and having a grid length of 30 cm was prepared in the following manner by using a base structure 200 including up to an upper electrode 206 prepared in the same manner as in Example 1.

On the device base structure 200, 100 $\mu$m-dia. copper wires coated with a carbon paste as coated metal members 208 were placed and fixed by an adhesive at the edge of a 7 mm-wide polyimide tape as an insulating layer 210. The carbon paste coating was prepared by coating the copper wires with the carbon paste prepared in Example 3 for forming the dots 211 and drying the carbon paste. Then, an electroconductive sheet prepared in the same manner and cut into a width of 5 mm was placed as an electroconductive layer 207 on end portions of the coated metal members 208 located outside the active area of the device so as to sandwich the end portions together with the insulating layer 210.

Then, a 6 mm-wide and 100 $\mu$m-thick copper foil as a busbar was placed on the electroconductive layer 207, and a heat and a pressure were applied to the entire structure from above the metal members 208 and the busbar 209 by a hot press similarly as in Example 1 to effect the electrode bonding. Then, a heat and pressure were applied locally from above the busbar 209 similarly as in Example 3 to enhance the bonding thereat.

The above-prepared device samples were encapsulated and then evaluated in the same manner as in example 1.

As a result of the initial stage performance evaluation, the encapsulated samples exhibited an average shunt resistance of 230 kohm.cm$^2$ and good conversion efficiencies of 9.4%±0.2%.

As a result of the reliability test, the encapsulated device samples showed a good series resistance increase of ca. 4.5% after the temperature—humidity cycle test.

Example 5

A photo-electricity generating device having a pin-junction triple-stacked structure having a structure as shown in FIGS. 8 and 9 and having a grid length of 30 cm was prepared in the same manner as in Example 4 except that the electroconductive layer 7 as an adhesive layer was formed in a thicknessn of 70 μm by applying the same electroconductive paste as in Example 1 on the insulating layer 210 and on the end portions of the metal members 208 above the insulating layer 210.

The above-prepared device samples were encapsulated and then evaluated in the same manner as in Example 1.

As a result of the initial stage performance evaluation, the encapsulated samples exhibited an average shunt resistance of 200 kohm.cm$^2$ and good conversion efficiencies of 9.3%±0.2%.

As a result of the reliability test, the encapsulated device samples showed a good series resistance increase of ca. 4.8% after the temperature—humidity cycle test.

As described above, according to the present invention, it is possible to provide a superposed or multi-layer electrode structure exhibiting a low resistivity and a high reliability and including an adhesive electroconductive layer showing a very high adhesiveness and well filling gaps near stepwise elevations.

Further, according to the present invention, it is also possible to provoide a photo-electricity generating device showing high initial stage performances and excellent reliability at a high yield.

What is claimed is:

1. An electrode structure, comprising:
    a rectangular substrate, a busbar disposed on and along a side of the rectangular substrate, a plurality of strip-form electroconductive sheets each comprising a polymeric resin and an electroconductive filler and disposed on the substrate so as to be connected with the busbar at an end thereof, and a plurality of bar-shaped or linear metal members each superposed on and embedded at least partially within one of the strip-form electroconductive sheets.

2. An electrode structure according to claim 1, wherein said electroconductive sheet has been formed through thermosetting of an electroconductive thermosetting composition containing a curing agent.

3. An electrode structure according to claim 1, wherein said electroconductive filler has an average particle size of 0.01 μm to 5 μm.

4. An electrode structure according to claim 1, wherein said electroconductive filler comprises a metal oxide.

5. An electrode structure according to claim 1, wherein the busbar comprises a material having a lower resistivity than the electroconductive sheet.

6. An electrode structure according to claim 1, wherein the busbar comprises a metal having a lower resistivity than the electroconductive sheet.

7. An electrode structure according to claim 1, wherein the busbar is coated with a metal layer.

8. An electrode structure according to claim 1, wherein at least a portion of the metal members is coated with an electroconductive paste.

9. A photo-electricity generating device, comprising:
    a semiconductor region,
    a transparent upper electrode disposed on the semiconductor region, and
    an electrode structure according to any one of claims 1 to 8 formed on at least a portion of the transparent electrode.

10. A process for producing an electrode structure, comprising:
    forming an electroconductive sheet comprising a polymeric resin and an electroconductive filler dispersed therein,
    superposing the electroconductive sheet on a substrate,
    superposing a bar-shaped or linear metal member on the electroconductive sheet to form a superposed structure, and
    applying heat and pressure onto the superposed structure to form an electrode structure wherein the metal member is physically and electrically connected to the substrate via the electroconductive sheet.

11. A process according to claim 10, wherein said electroconductive filler has an average particle size of 0.01 μm to 5 μm.

12. A process according to claim 10, wherein said electroconductive filler comprises a metal oxide.

13. A process according to claim 10, wherein a portion of the metal member is coated with a metal paste.

14. A process for producing an electrode structure, comprising:
    forming an insulating layer locally on a substrate,
    superposing a bar-shaped or linear metal member on the substrate,
    superposing a preformed electroconductive sheet comprising a polymeric resin and an electroconductive filler dispersed therein on the metal member,
    superposing a busbar on the electroconductive sheet to form a superposed structure, and
    applying heat and pressure onto the superposed structure to form an electrode structure wherein the busbar and the metal member are physically and electrically connected to each other via the electroconductive sheet.

15. A process according to claim 14, wherein said electroconductive filler has an average particle size of 0.01 μm to 5 μm.

16. A process according to claim 14, wherein said electroconductive filler comprises a metal oxide.

17. A process according to claim 14, wherein the busbar comprises a material having a lower resistivity than the electroconductive sheet.

18. A process according to claim 14, wherein the busbar is coated with a metal layer.

19. A process according to claim 14, wherein a portion of the metal member is coated with an electroconductive paste.

20. A process for producing a photo-electricity generating device, comprising a semiconductor region, a transparent upper electrode disposed on the semiconductor region, and an electrode structure on the transparent upper electrode, wherein a step for producing the electrode structure on the transparent upper electrode comprises the process according to claim 10 or 14.

* * * * *

UNITED STATES PATENT AND TRADEMARK OFFICE
CERTIFICATE OF CORRECTION

PATENT NO.    : 6,051,778
DATED         : April 18, 2000
INVENTOR(S)   : HIROFUMI ICHINOSE ET AL.

It is certified that error appears in the above-identified patent and that said Letters Patent is hereby corrected as shown below:

COLUMN 13

Line 48, "fied" should read --fixed--.

COLUMN 14

Line 41, "an" should read --and--.

COLUMN 16

Line 10, "imetal" should read --metal--.

Signed and Sealed this

Twenty-second Day of May, 2001

Attest:

NICHOLAS P. GODICI

Attesting Officer     Acting Director of the United States Patent and Trademark Office